US011839275B2

(12) United States Patent
Willcox et al.

(10) Patent No.: US 11,839,275 B2
(45) Date of Patent: Dec. 12, 2023

(54) MULTI-PURPOSE THERMOREGULATING ELECTRONICS DEVICE CASE WITH DYNAMIC ATTACHMENT MECHANISMS

(71) Applicant: Qore Performance, Inc., Sterling, VA (US)

(72) Inventors: J. D. Willcox, Sterling, VA (US); Justin B. Li, Sterling, VA (US)

(73) Assignee: Qore Performance, Inc., Sterling, VA (US)

( * ) Notice: Subject to any disclaimer, the term of this patent is extended or adjusted under 35 U.S.C. 154(b) by 266 days.

(21) Appl. No.: 17/320,448

(22) Filed: May 14, 2021

(65) Prior Publication Data

US 2021/0353019 A1 Nov. 18, 2021

Related U.S. Application Data

(60) Provisional application No. 63/025,366, filed on May 15, 2020.

(51) Int. Cl.
| | | |
|---|---|---|
| A45C 11/00 | (2006.01) | |
| A45C 15/00 | (2006.01) | |
| H04B 1/3877 | (2015.01) | |
| A45C 13/30 | (2006.01) | |
| A45C 13/02 | (2006.01) | |
| H05K 7/20 | (2006.01) | |

(52) U.S. Cl.
CPC ............. *A45C 11/00* (2013.01); *A45C 13/30* (2013.01); *A45C 15/00* (2013.01); *H04B 1/3877* (2013.01); *A45C 2011/003* (2013.01); *A45C 2013/025* (2013.01); *H05K 7/20* (2013.01)

(58) Field of Classification Search
CPC .............. A45C 11/00; A45C 2013/025; A45C 2011/002; A45C 2011/003; A45C 13/30; A45C 15/00; H04B 1/3877; H05K 7/20; G06F 1/203; G06F 1/206; G06F 1/1628; G06F 2200/1633
See application file for complete search history.

(56) References Cited

U.S. PATENT DOCUMENTS

| | | | | |
|---|---|---|---|---|
| 7,522,411 | B2 * | 4/2009 | Haglund | G06F 1/203 361/679.55 |
| 8,089,753 | B2 * | 1/2012 | Dotson | A45C 11/00 361/679.48 |
| 9,861,005 | B2 * | 1/2018 | Li | G06F 1/203 |
| 2014/0131244 | A1 * | 5/2014 | Chambers | G06F 1/203 206/521 |
| 2015/0017905 | A1 * | 1/2015 | Li | H05K 7/20163 454/184 |
| 2015/0208789 | A1 * | 7/2015 | Pylkovas | A45F 3/02 224/607 |
| 2017/0322590 | A1 * | 11/2017 | Jacobs | H04M 1/026 |

* cited by examiner

Primary Examiner — Corey N Skurdal
(74) Attorney, Agent, or Firm — DLA PIPER LLP (US)

(57) ABSTRACT

A multi-purpose case that holds a portable computing device and an interchangeable thermoregulation element such that the thermoregulation element can be replaced without removing (or moving) the portable computing device. The case has modular components and can be attached to a light shield and or a document holder.

18 Claims, 20 Drawing Sheets

MULTI-PURPOSE THERMOREGULATING ELECTRONICS DEVICE CASE WITH DYNAMIC ATTACHMENT MECHANISMS

PRIORITY

This application claims priority to U.S. provisional Patent Application No. 63/025,366, filed on May 15, 2020, which is incorporated herein by reference in its entirety.

BACKGROUND

The use of portable computing devices in commercial applications such as food production, food distribution, drive-thru service, events, transportation, HVAC/trades contractors, and manufacturing has become a modern business necessity. The incredible versatility, portability and power of modern portable computing devices (i.e., IPHONE, IPAD, SURFACE, etc.) makes them useful in a wide range of fields. The strong emphasis on aesthetics and display resolution make them beautiful. This combination of power, versatility and aesthetics makes these personal computing devices delicate and vulnerable to environmental threats and hazards. Their incredible utility has placed these devices into application environments for which they were never designed.

This gap between design intent and real world application creates challenges, limitations and risks for the user, from breakage to operating temperature vulnerability to light glare rendering the screen unreadable. In particular, battery life can be severely compromised due to overheating in commercial outdoor environments. This use case for convenience and customer safety has created the need to carry and display documents for informational purposes. Electronic and paper documents must be concurrently accessible to the service provider to share relevant details with the customer to facilitate transaction speed and consistency.

There is a distinct need within the community of portable computing device users for a case that protects the device from environmental and use hazards, including temperature regulation, while also carrying documents and other accessories required for in-person transactions in a manner that makes interaction easier for the parties involved. To facilitate consistent performance in thermoregulation and impact protection, the device must fit securely into the case and the case must consistently hold the thermal element against the electronic device without dislodging the device from this secure enclosure. However, since transaction accessories such as documents, menus, credit card readers, promotional coupons, and the electronic devices themselves are different sizes and of different forms depending on the user's preference, the thermoregulating case must be adaptable to securely hold these various items which typically are not specifically known.

SUMMARY

Embodiments disclosed herein include a multi-purpose thermoregulating electronics device case with dynamic attachment mechanisms having a detachable magazine for thermoregulation of the device (e.g., portable computing device). The protective case is made of a flexible thermoplastic to securely hold the device in place while also absorbing impact to prevent the device from breaking if dropped. The detachable magazine consists of an optional holster and a thermoregulating container. The thermoregulating container may contain or may be made directly of cooling or heating elements that add heat to or remove heat from the electronic device and thus extend the device's battery life depending on the user's environment and preference. The container is not insulated on the side contacting the electronic device so as to affect conductive thermoregulation. The container may be used to prevent any liquid (for example phase change material) from directly contacting the personal computing device while still providing the conductive benefit.

Heating elements work substantially the same way. When inserted into the protective case, physical contact between the element and the portable computing device conductively warms the device. In one or more embodiments, the floor of the case pushes the device and the thermoregulating container into contact with each other.

In one embodiment, a case adapted to hold a portable computing device is provided. The case comprises: a case body having an opening adapted to receive the portable computing device and a cavity adapted to receive a magazine. The magazine is adapted to fit within the cavity in the case body such that a bottom of the case body pushes on the magazine such that the thermoregulation element makes contact with the device when inserted in the cavity and carrying the thermoregulation element.

DETAILED DESCRIPTION

Figure 1:
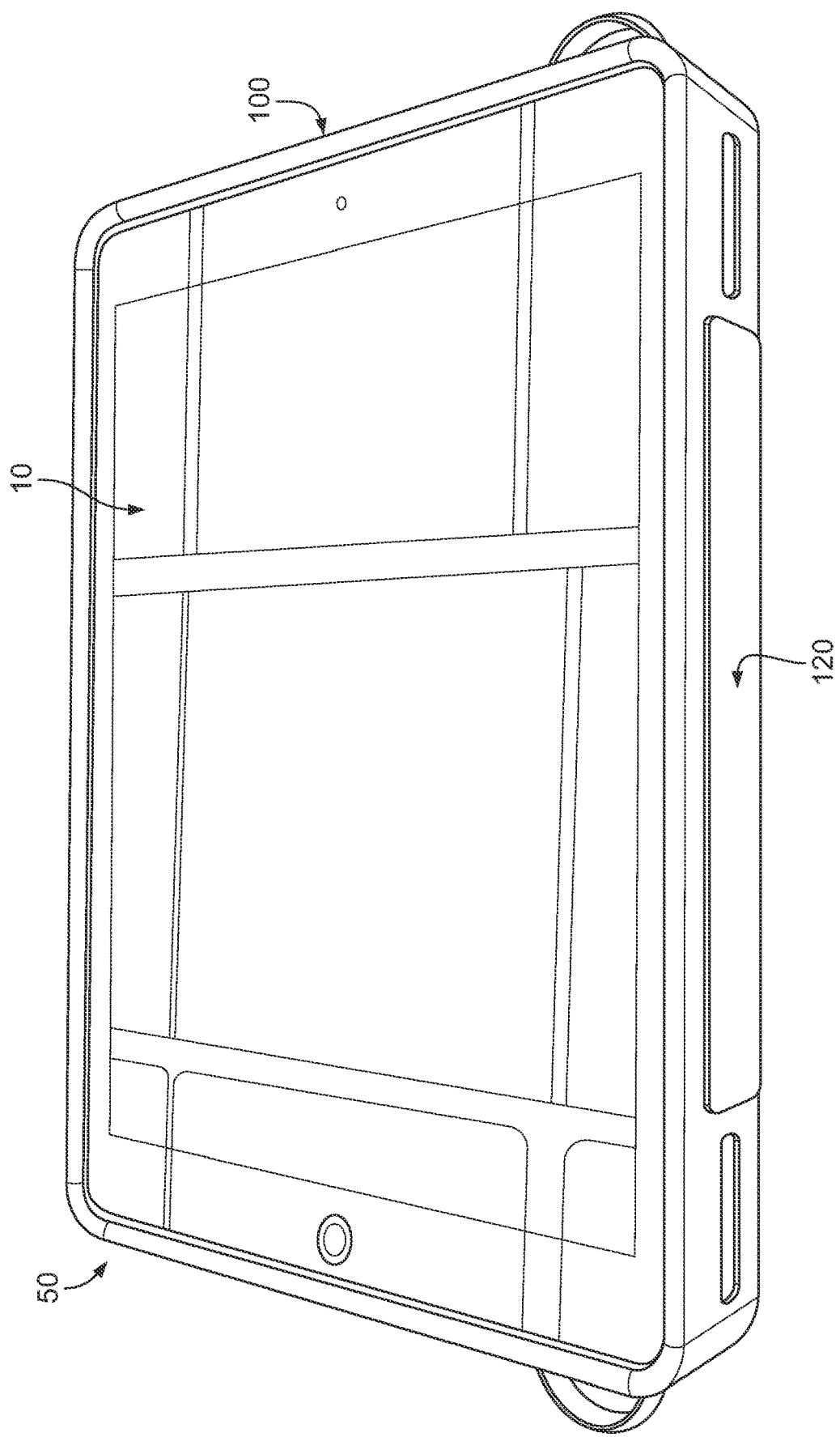
FIGS. 1-3 illustrate an example multi-purpose thermoregulating electronics device case constructed in accordance with the disclosed principles and in use with a portable computing device.
Figure 2:
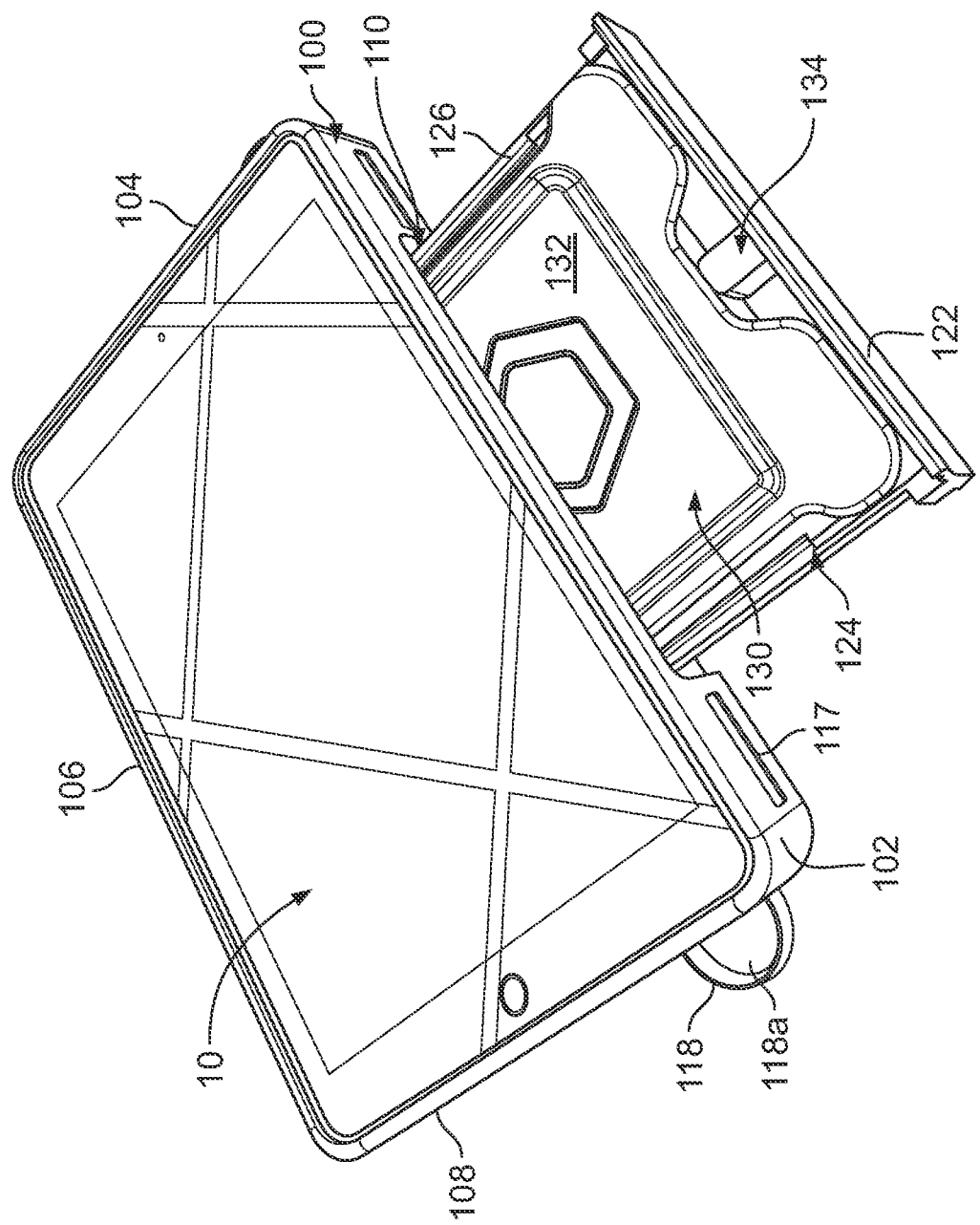
Figure 3:
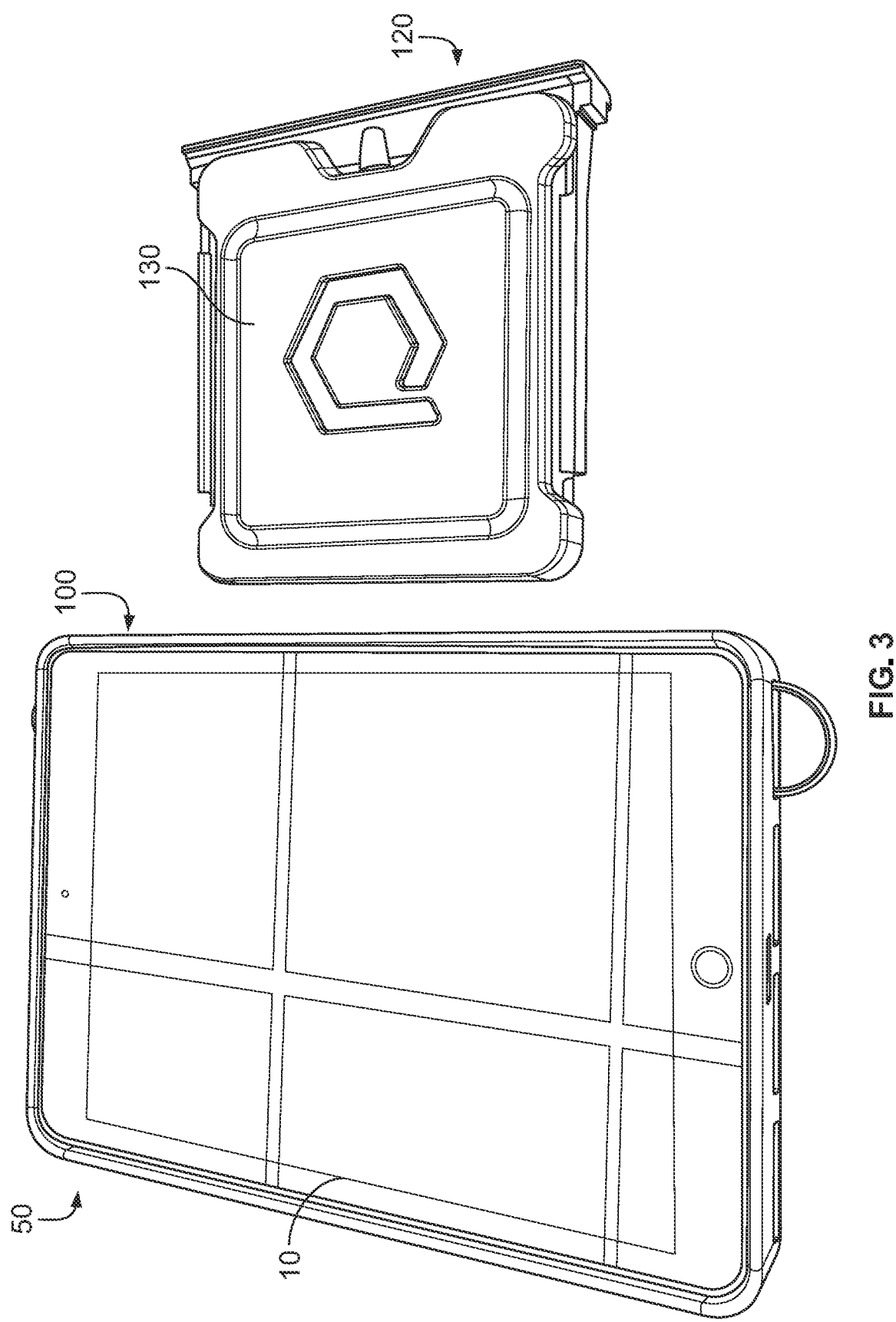
Figure 13:
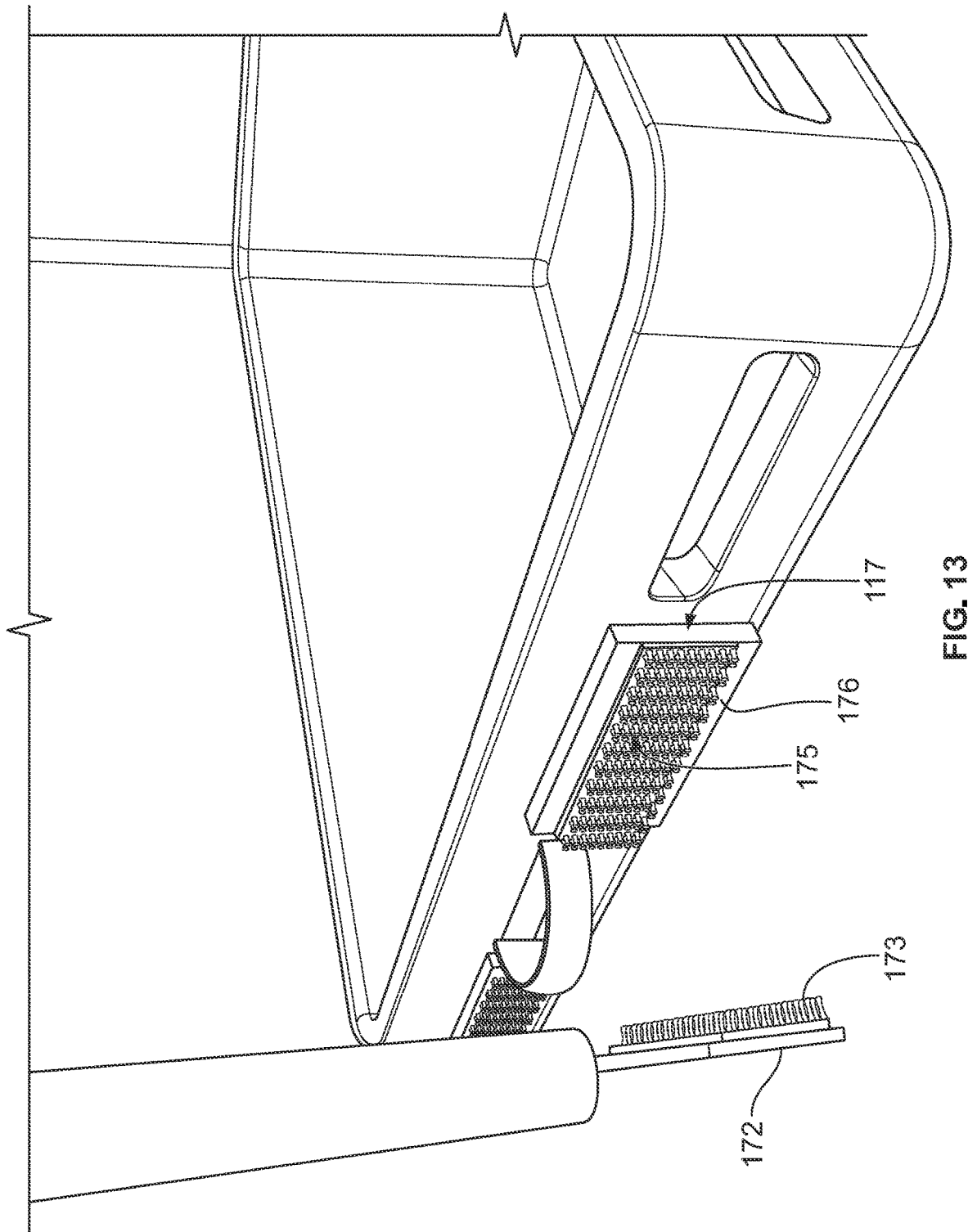
FIGS. 13 and 14 illustrate example attachment mechanisms for the light shield constructed in accordance with the disclosed principles.
Figure 14:
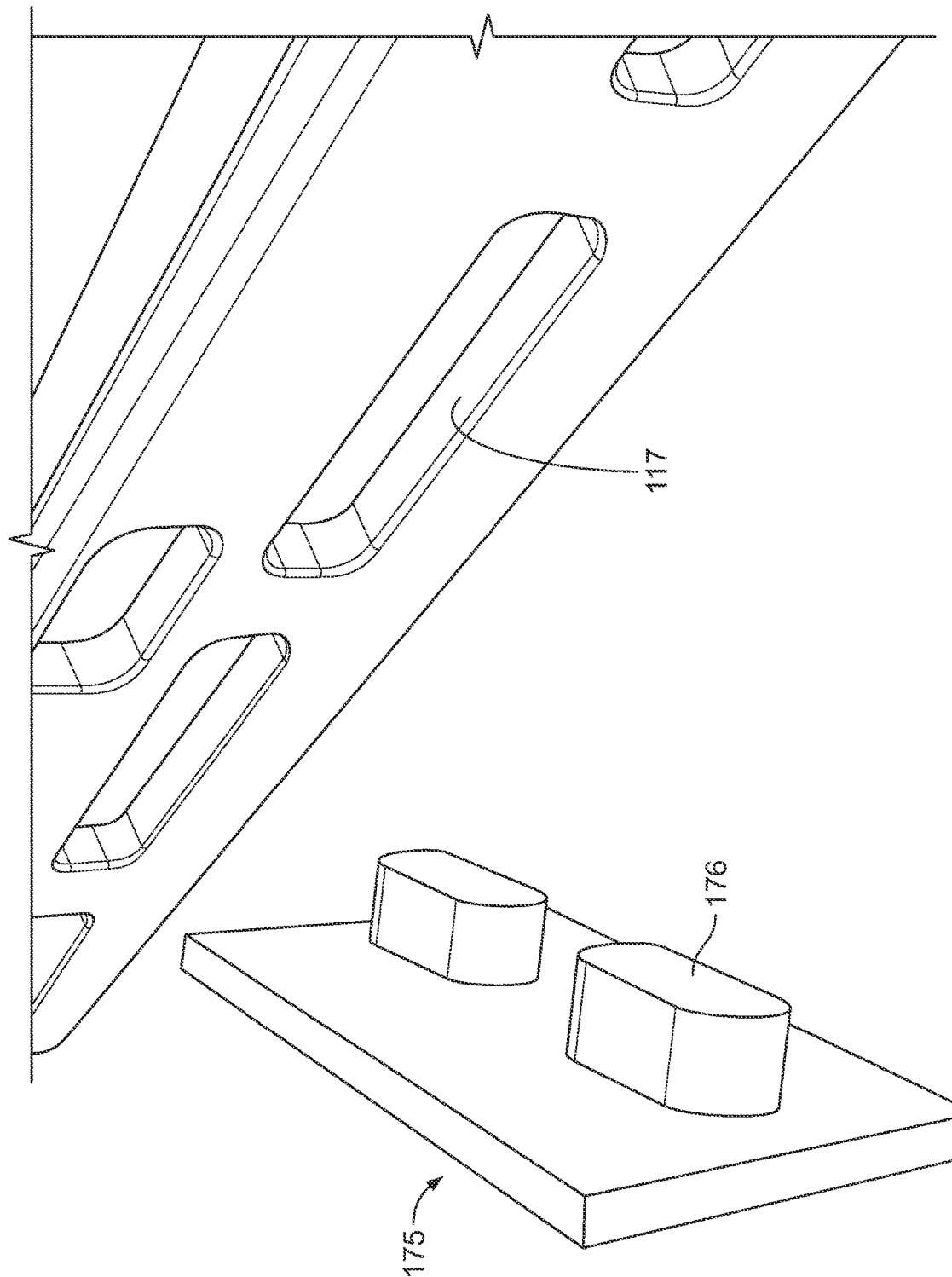

FIGS. 1-3 illustrate an example multi-purpose thermoregulating electronics device case 50 constructed in accordance with the disclosed principles and in use with a portable computing device 10. The illustrated example contains a case body 100 and a magazine 120 for a thermoregulating container 130. The case body 100 includes four walls 102, 104, 106, 108 and a bottom 113 (FIG. 5) connected to and integrally molded together from the same material as the walls 102, 104, 106, 108. In the illustrated embodiment, an inner cavity 110 is formed through the first wall 102 to serve as an opening for receiving the magazine 120 and container 130. An outer cavity 101 (FIGS. 5, 9) is formed around the inner cavity 110 and is defined by the space between the walls 102, 104, 106, 108 of the body and the walls 114, 115, 116 of the cavity 110. Each wall 102, 104, 106, 108 may also include slots 117 for receiving various components, including a tension-fit accessory 118 and or a shield attachment accessory 175 (FIGS. 13, 14) discussed in more detail below.

Figure 4:
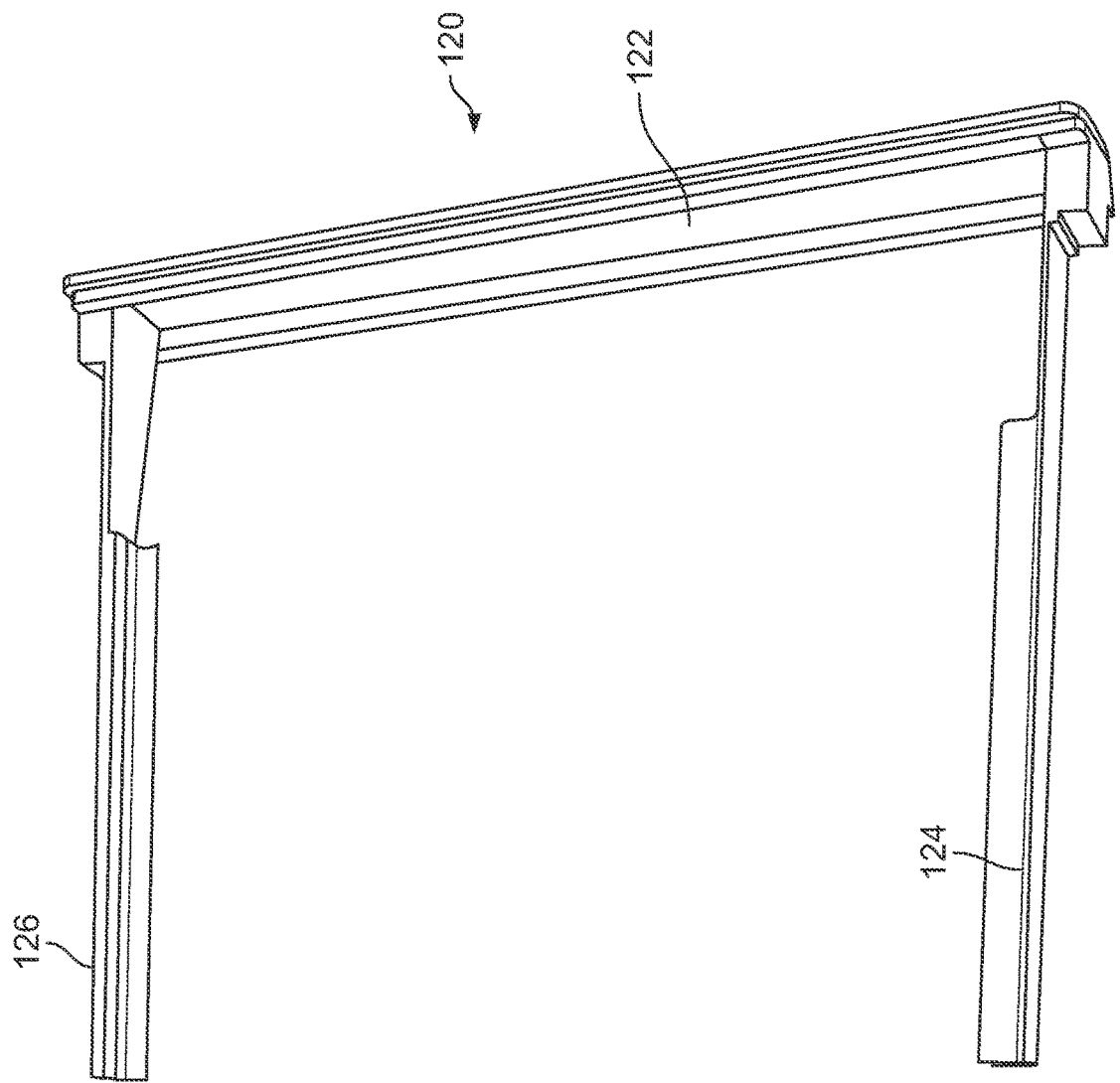
FIG. 4 illustrates an example magazine that may be used with the multi-purpose thermoregulating electronics device case constructed in accordance with the disclosed principles.

In the illustrated example, the magazine 120 includes a face plate 122 attached to two rails 124, 126 (shown in more detail in FIG. 4), which are passed through the cavity 110. In the illustrated example, and shown in more detail in FIG. 5, the cavity 110 includes slot portions 114, 116 for receiving the rails 124, 126. As will become apparent, the floor 113 of the case body 100 pushes the device 10 and the thermoregulating container 130 into contact with each other. Moreover, the configuration of the magazine 120 and cavity 110 allows the container 130 to be removed and or replaced without the need to take the device 10 out of the case 50. This is particularly advantageous when the user is out in the field and requires a quick change and cannot afford (in terms of time and or effort) to dismount the device 10 from the case 50.

Figure 5:
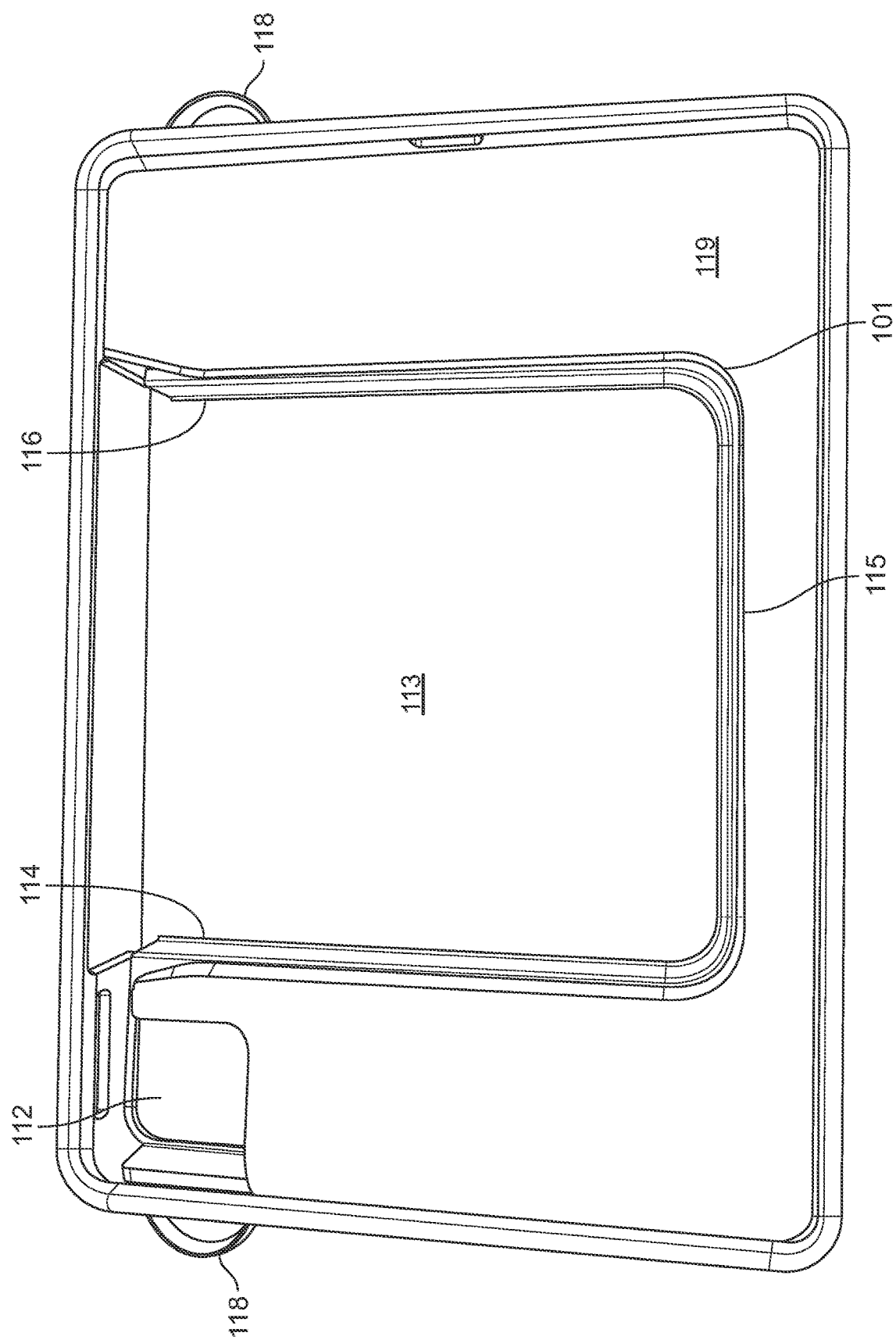
FIG. 5 illustrates the multi-purpose thermoregulating electronics device case constructed in accordance with in accordance with the disclosed principles without the computing device illustrated in FIG. 1.

In addition, as shown in FIG. 5, the floor 113 includes a hole 112 sized to provide a camera, lens and flash portion of the computing device 10 with an unobstructed view through the body 100 and therefore maintain the device's ability to take pictures and video and or use the flash (i.e., for taking pictures, video or being used as a flashlight) when needed.

FIG. 5 illustrates an adapter 119 within the body 100 and also securing tension-fit accessories 118. The adapter 119 is preferably used as a mounting surface for the computing device 10 and helps, with the aid of a lipped portion 103 (FIG. 11B) of the body walls 102, 104, 106, 108, maintain the device 10 securely within the body 100. In one or more embodiments, the adapter 119 is made of foam or similar durable material and is sized to accommodate different sized devices 10 (discussed in more detail below with respect to FIGS. 10 and 11A. In one or more embodiments, the adapter 119 may not be included. Instead, the device 10 may be supported by internal walls and structure of the case body 100. In one or more embodiments, the adapter may be built as a lattice into a unibody case body 100, or a platform designed into the case body 100 to hold the device 10.

In the illustrated example, the container 130 has a hollow body 132 for receiving cooling or heating elements and a cap 134. In one or more embodiments, the cooling elements may be a liquid, frozen material, or a phase-change material such that when inserted into the protective case body 100 and makes physical contact with the portable computing device 10, it is designed to remove heat from the portable computing device 10 conductively. Heating elements can include, but are not limited to, exothermic iron oxide materials, battery-powered heaters, or insulative foam. Other heating or cooling elements are possible provided that direct contact between the device and the thermoregulating container is maintained.

Figure 6:
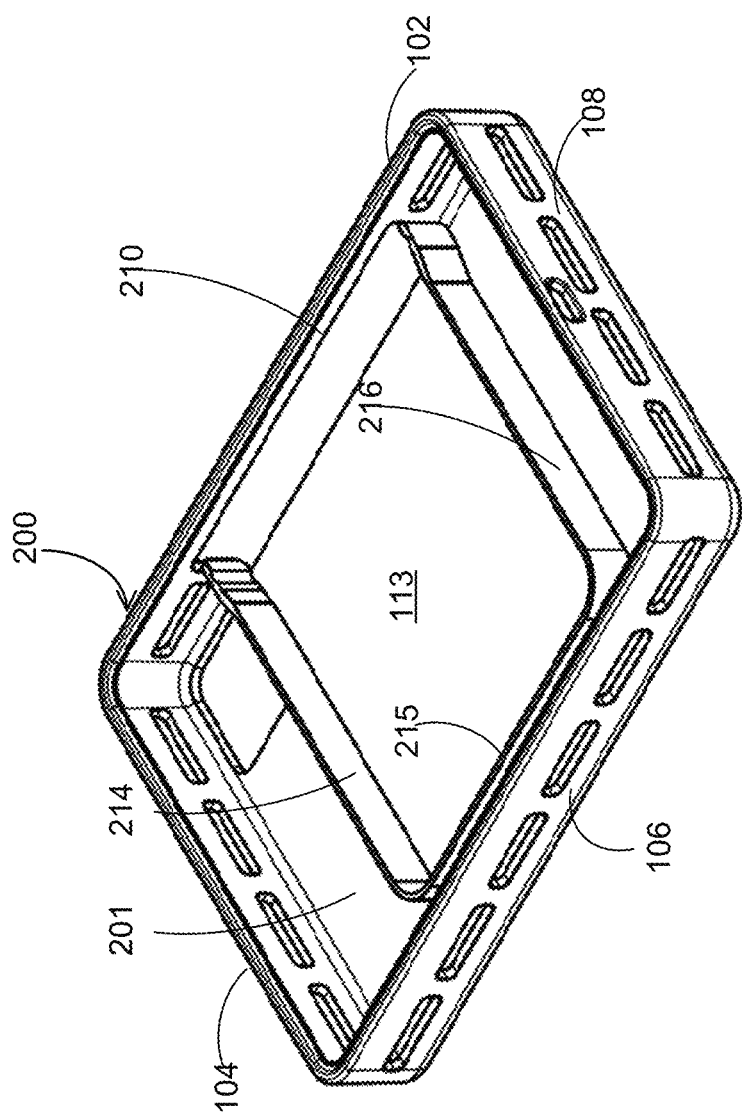
FIG. 6 illustrates another example of the multi-purpose thermoregulating electronics device case constructed in accordance with the disclosed principles.
Figure 7:
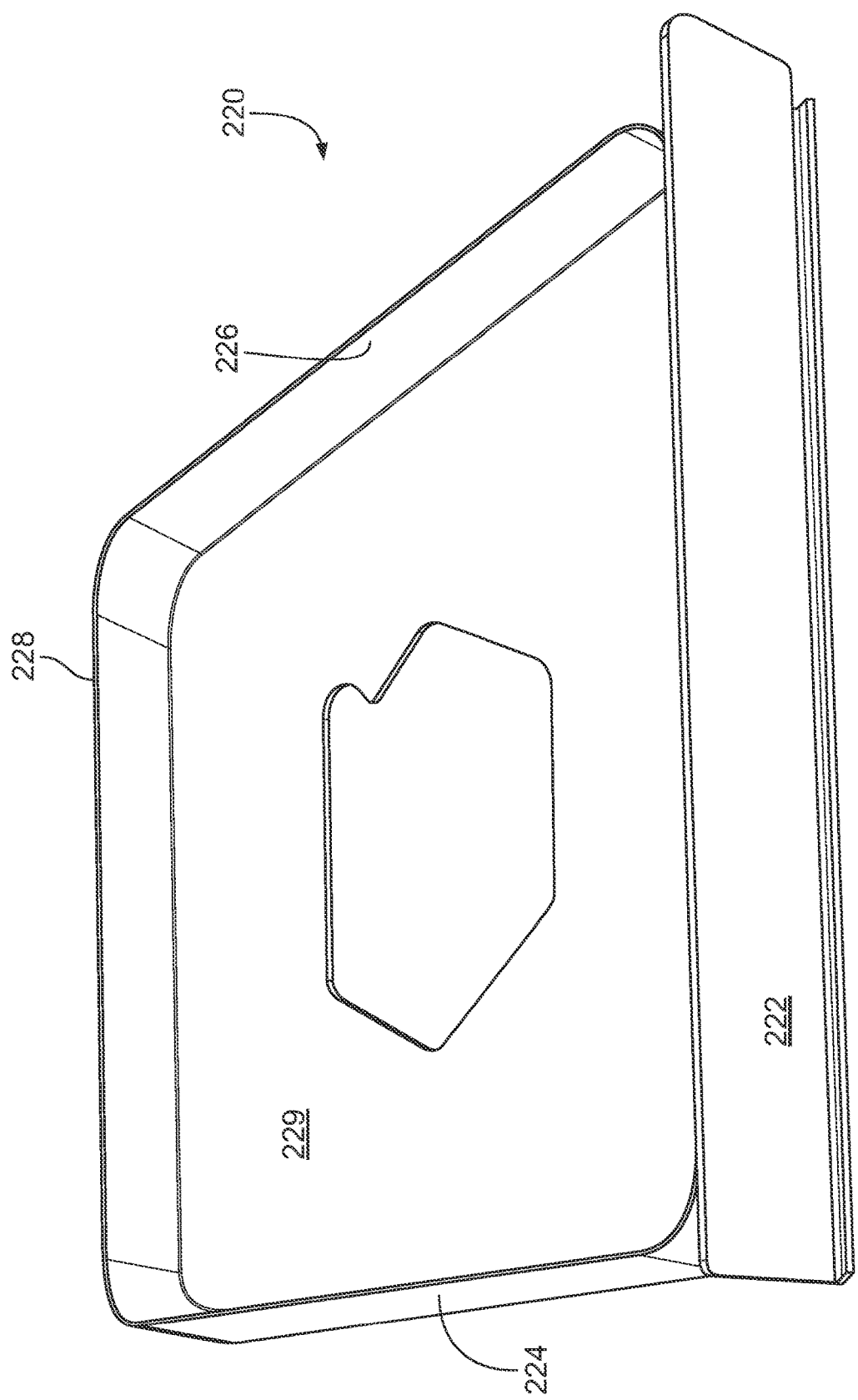
FIG. 7 illustrates another example magazine that may be used with the multi-purpose thermoregulating electronics device case constructed in accordance with the disclosed principles.

FIG. 6 illustrates a body 200 with a slightly modified inner cavity 220 for receiving a slightly modified magazine 220 (FIG. 7). In the illustrated example, the cavity 210 comprises walls 214, 215, 216, which along with the floor 113, form a holster for the magazine 220 and container 130. An outer cavity 201 is formed around the inner cavity 210 and is defined by the space between the body's walls 102, 104, 106, 108 the walls 214, 215, 216 of the cavity 210. As shown in FIG. 7, the magazine 220 includes a faceplate 222 and walls 224, 226, 228 attached to a bottom portion 229 integrally molded together from the same material. The illustrated configuration is more robust and sturdy than the unmodified magazine 110. In the illustrated example, the magazine walls 224, 226 are smooth and are held in place by the smooth walls 214, 216 of the cavity 210. Rails and slots are not required as the contact between the various walls and bottom portions form a snug fit for maintain the magazine 220 within the cavity 210. In addition, the floor 113 of the case body 200 pushes the device 10 and the thermoregulating container 130 into contact with each other. Moreover, the configuration of the magazine 220 and cavity 210 allows the container 130 to be removed and or replaced without the need to take the device 10 out of the case 50.

Figure 8:
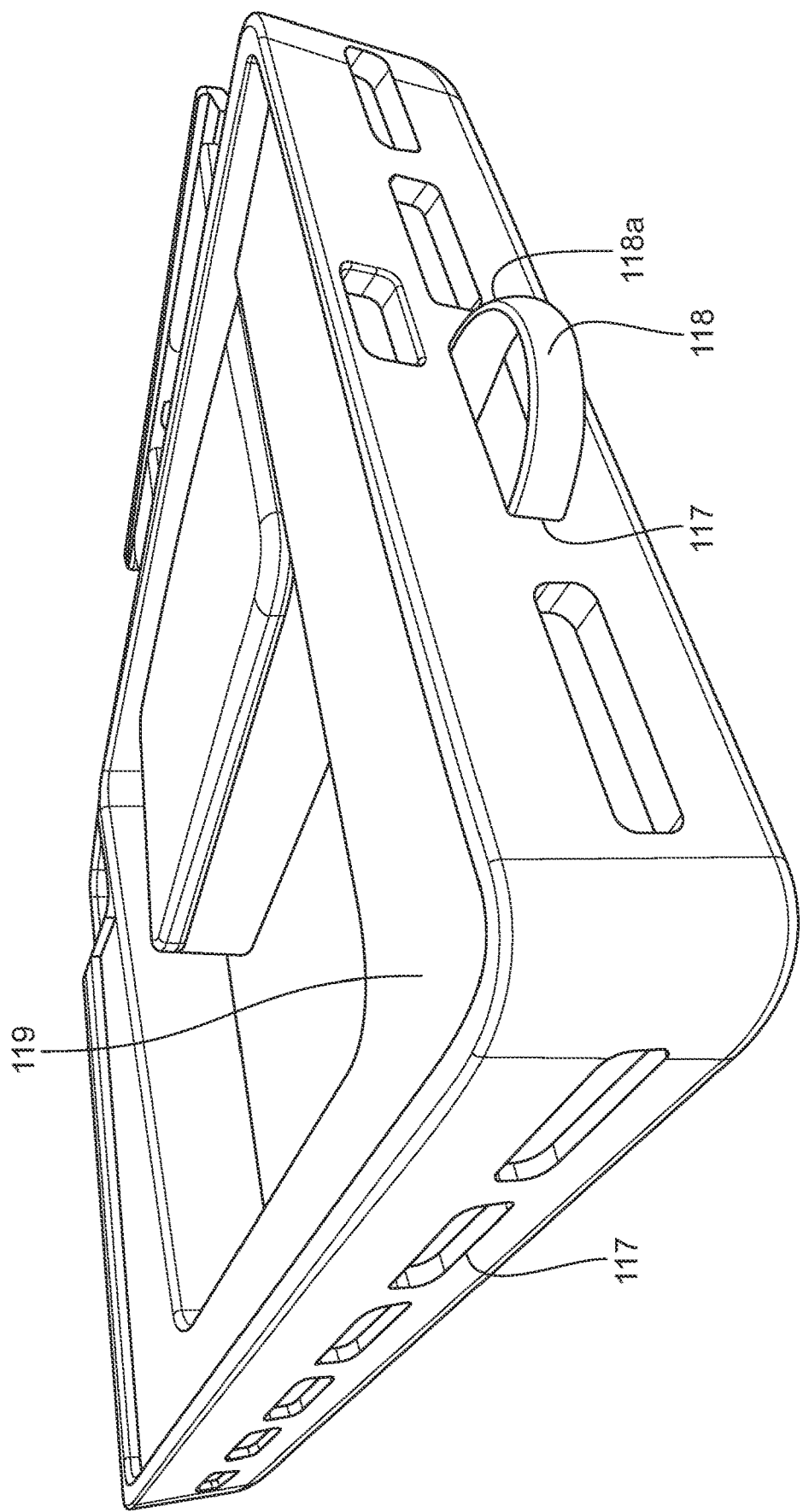
FIGS. 8-11B illustrate examples of various components and features of the multi-purpose thermoregulating electronics device case constructed in accordance with the disclosed principles.
Figure 9:
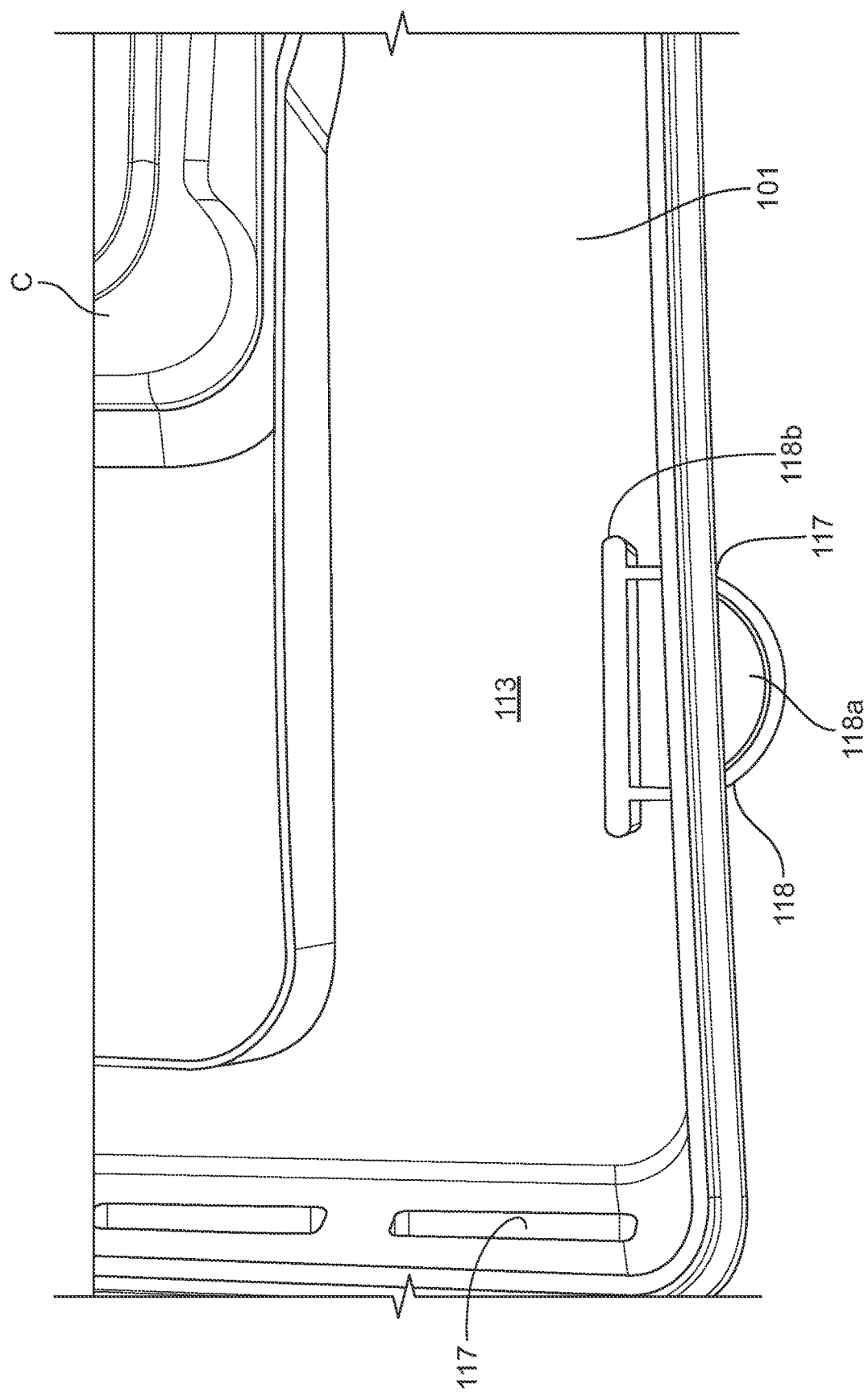

FIGS. 8 and 9 provide close up views of the slots 117, accessory 118 and adapter 119. The accessory 118 has an open loop portion 118a and a base portion 118b. The base portion 118b contacts a bottom portion of the adapter 119 to maintain the adapter 119 by tension fit. As will be discussed below in more detail, the loop portion 118a may be used as an attachment mechanism for a strap or other holster device.

Figure 10:
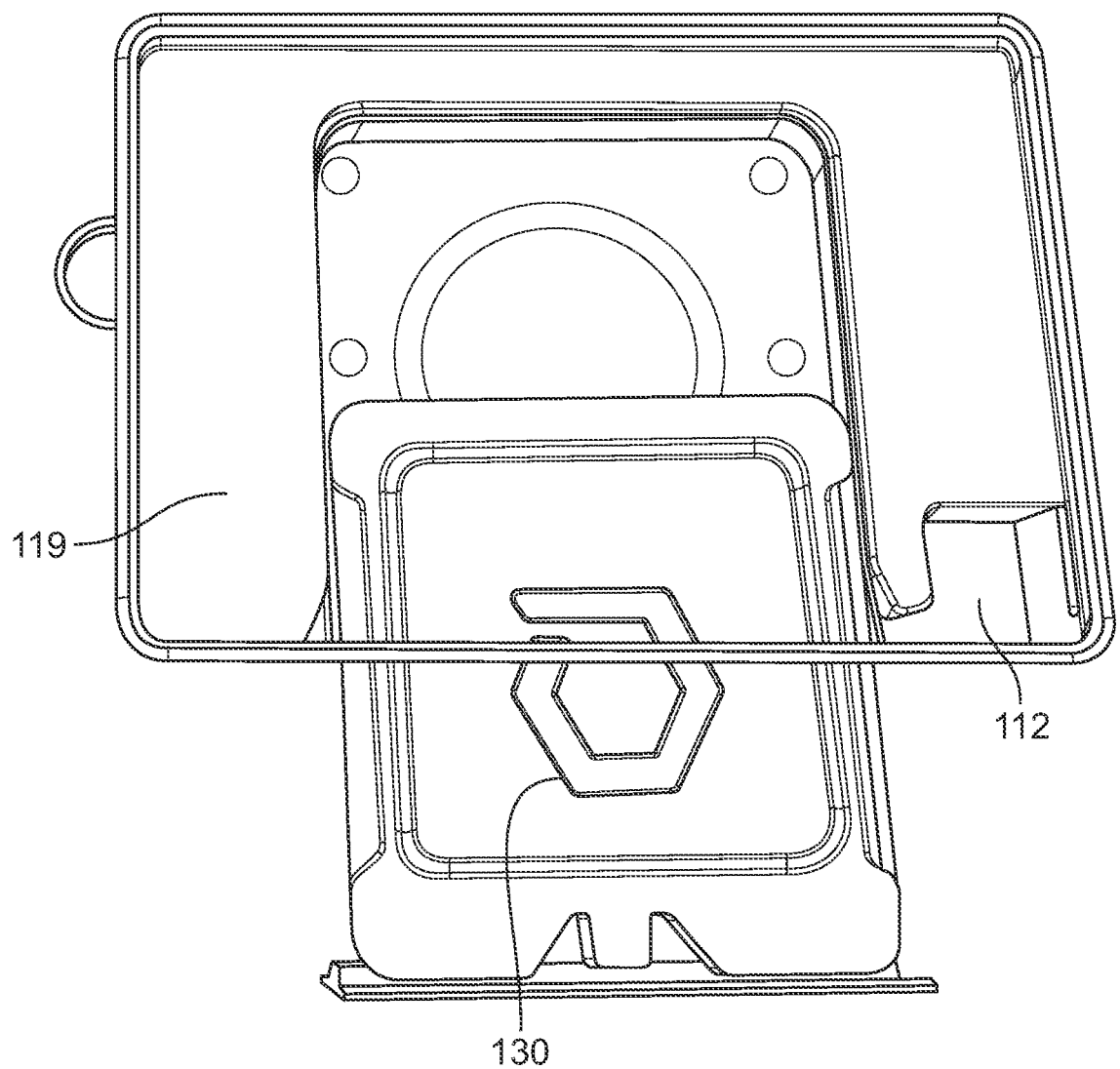

FIG. 10 illustrates the adapter 119 having a generally U-shape and having a first size adapted for standard sized portable computing tablet devices such as e.g., an IPAD 10.2 and later tablets. The bottom portion of the adapter 119 fits within the outer cavity portion 101, 201 of the case body 100, 200. In one or more embodiments, the top and bottom portion of the adapter 119 may be the same size and configuration.

Figure 11A:
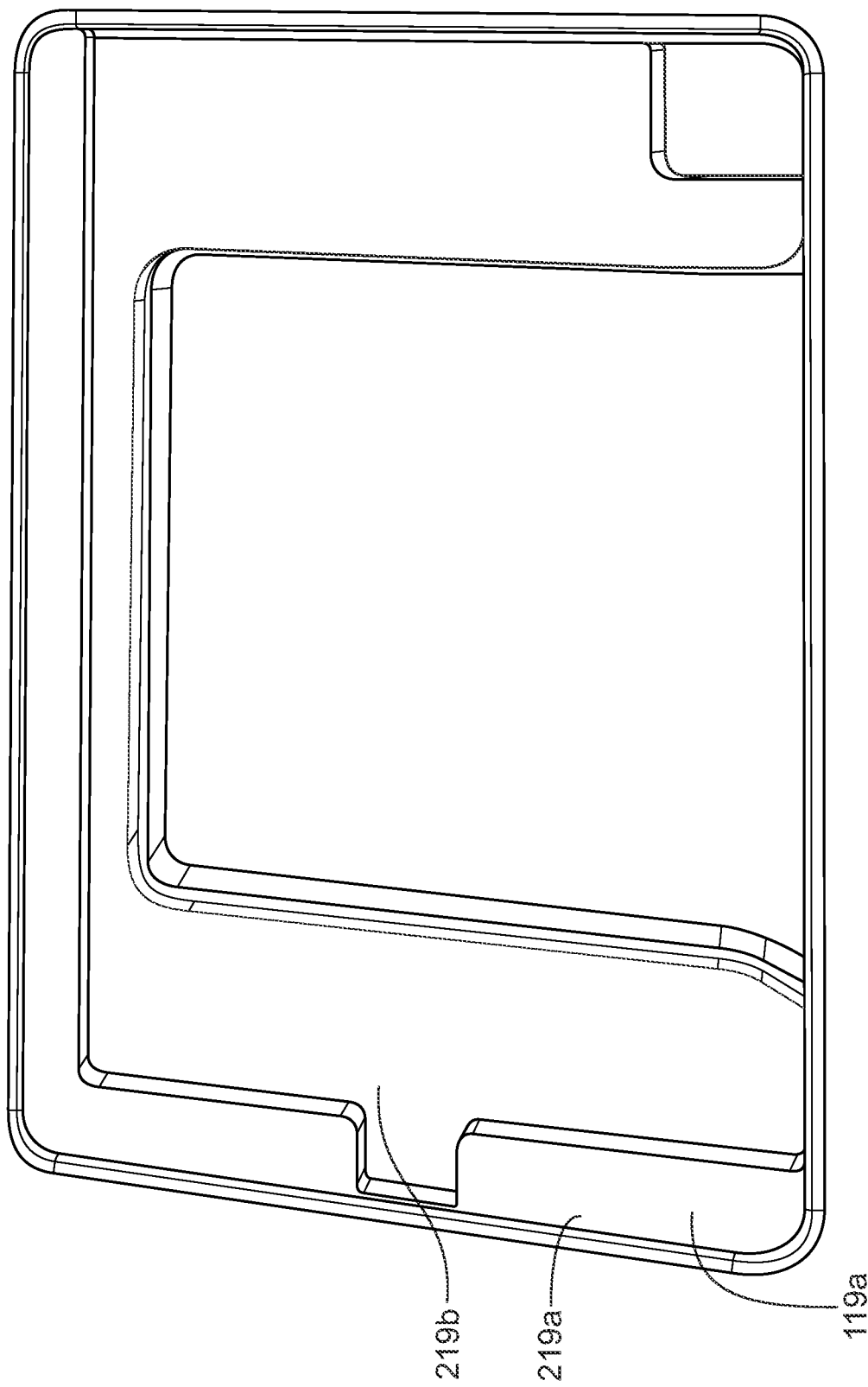
Figure 11B:
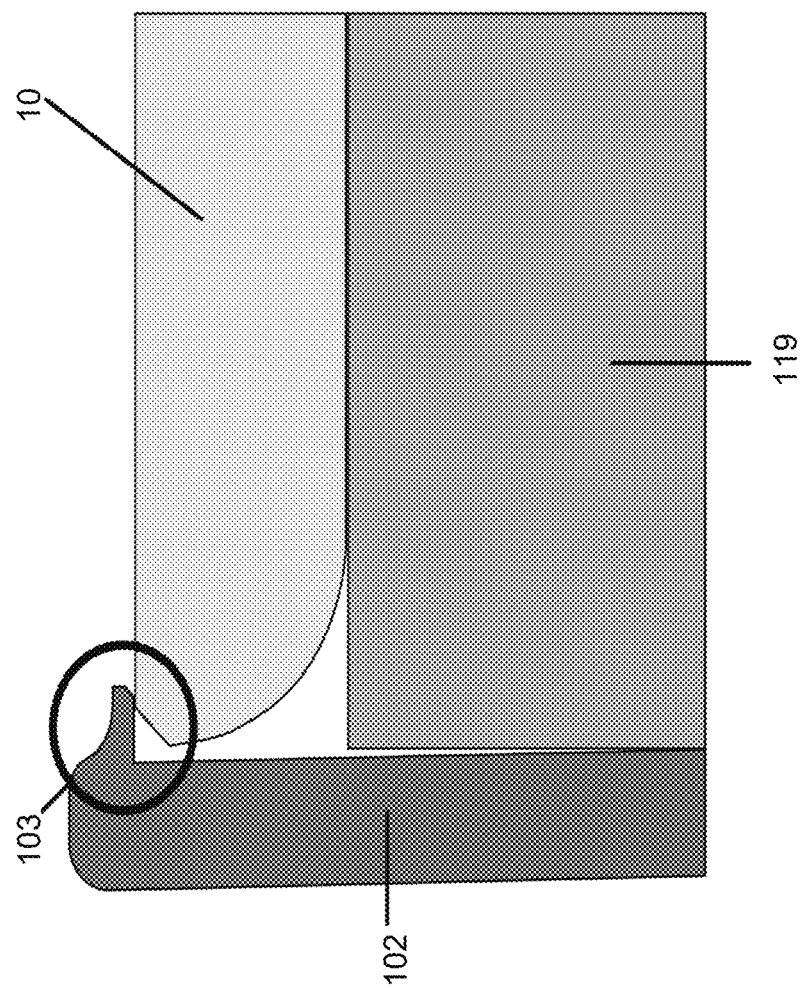

FIG. 11A illustrates a modified adapter 119a having a top portion 219a sized for smaller sized portable computing tablet devices such as e.g., an IPAD MINI tablet. That is, the top portion 219a will extend inwardly from the outside walls of the case body and will be used to maintain the device 10 within the adapter 119a. In one or more embodiments, the modified adapter 119a will have a lip portion (similar to lip portion 103) to help maintain the device 10 within the adapter 119a.

The modified adapter 119a has a bottom portion 219b that fits within the outer cavity portion 101, 201 of the case body 100, 200. As such, the case body 100, 200 does not need to be changed to accommodate different sized portable computing devices 10. This means that the same case body mold and manufacturing process can be used as the case dimensions themselves do not need to be changed, making the case 50 a universal case for the industry.

Figure 12:
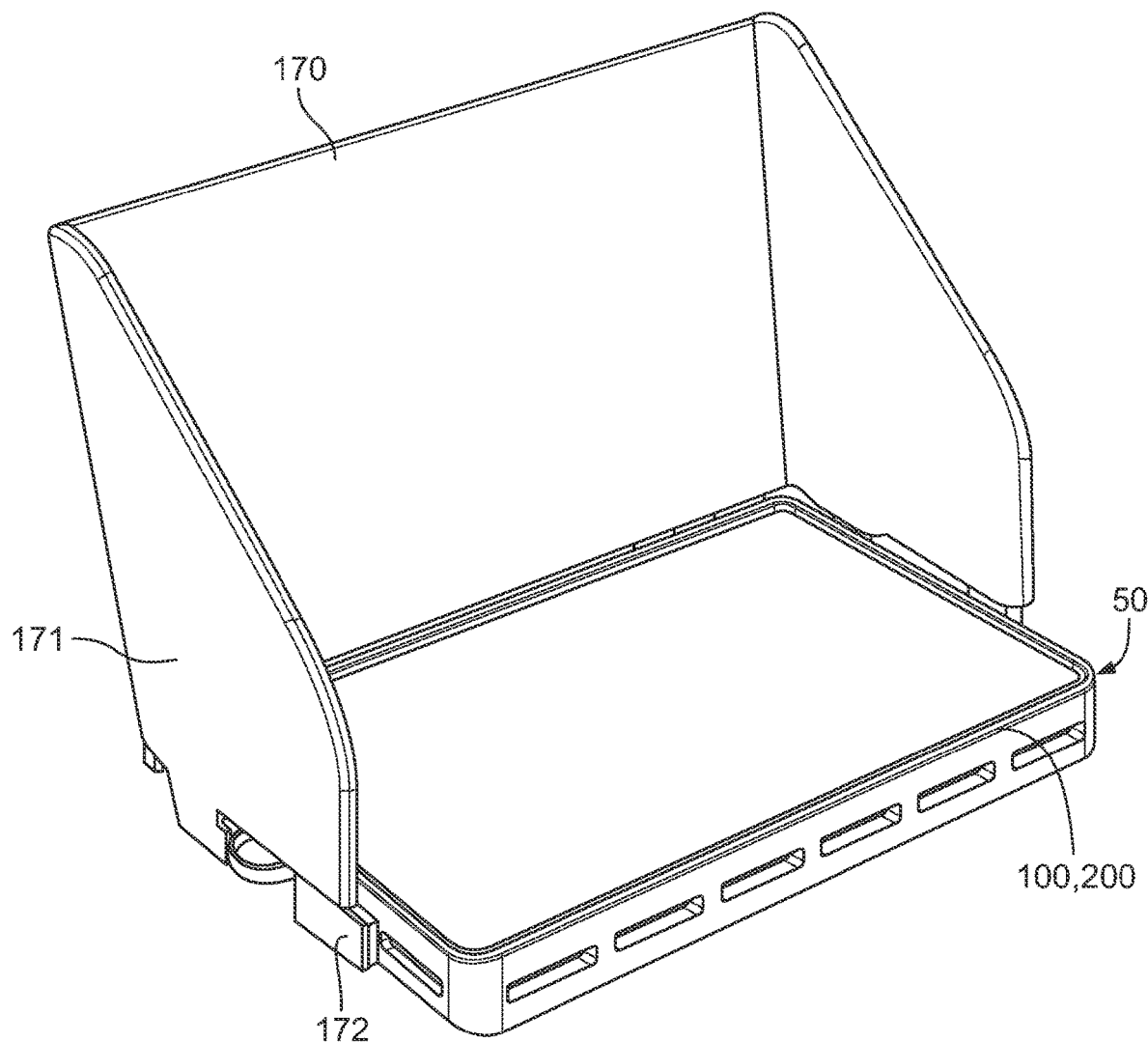
FIG. 12 illustrates an example light shield that may be attached to the multi-purpose thermoregulating electronics device case constructed in accordance with the disclosed principles.

FIG. 12 illustrates an example light shield 170 that may be attached to the multi-purpose thermoregulating electronics device case 50 constructed in accordance with the disclosed principles. As can be appreciated, the light shield may be attached to a case 50 to block unwanted light from interfering with the user's ability to see and use the device 10. The light shield 170 may be attached in the landscape mode or portrait mode to accommodate how the user is using the device 10.

The illustrated shield 170 has a tri-fold body 171 attached to a plurality of attachment portions 172. As shown in more detail in FIGS. 13 and 14, the attachment portions 172 have an engagement portion 173 that engages an engagement portion 176 of an attachment mechanism 175 inserted through a slot 117 of the case body 100, 200. In the illustrated example, the attachment mechanism comprises one or more protrusions 176 that are received within a slot 117 and maintained by tension due to the sizing of the slot 117 and protrusions 176. In the illustrated example, the engagement portions 173, 176 are respective portions of a hook and loop fastening system (e.g., separate portions of a VELCRO strap). As noted above, the light shield 170 may be attached in the landscape mode or portrait mode by arranging the attachment mechanisms 175 in different slots 117 around the case body 100, 200.

Figure 15:
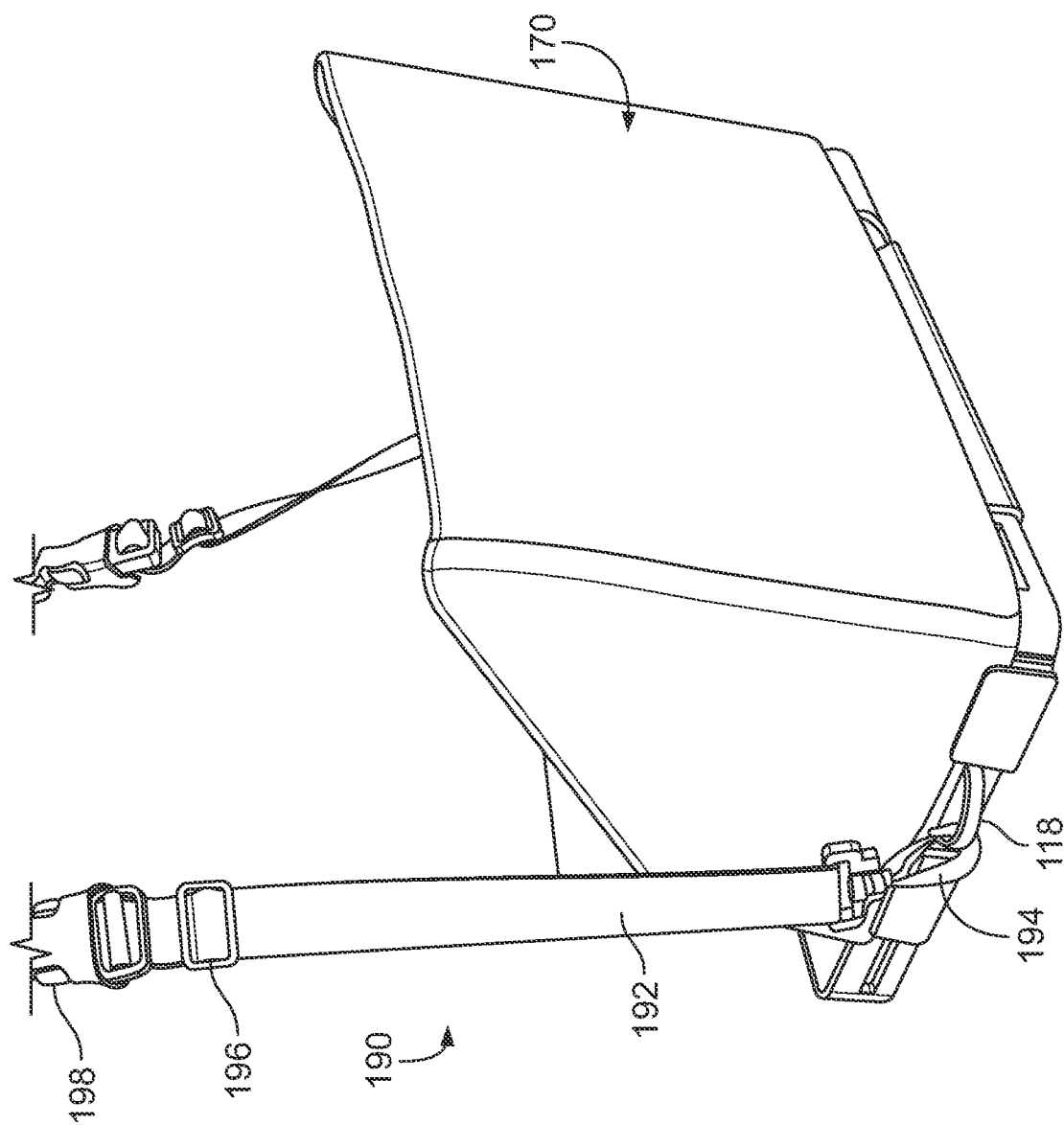
FIG. 15 illustrates an example strap mechanism for the multi-purpose thermoregulating electronics device case constructed in accordance with the disclosed principles.
Figure 16:
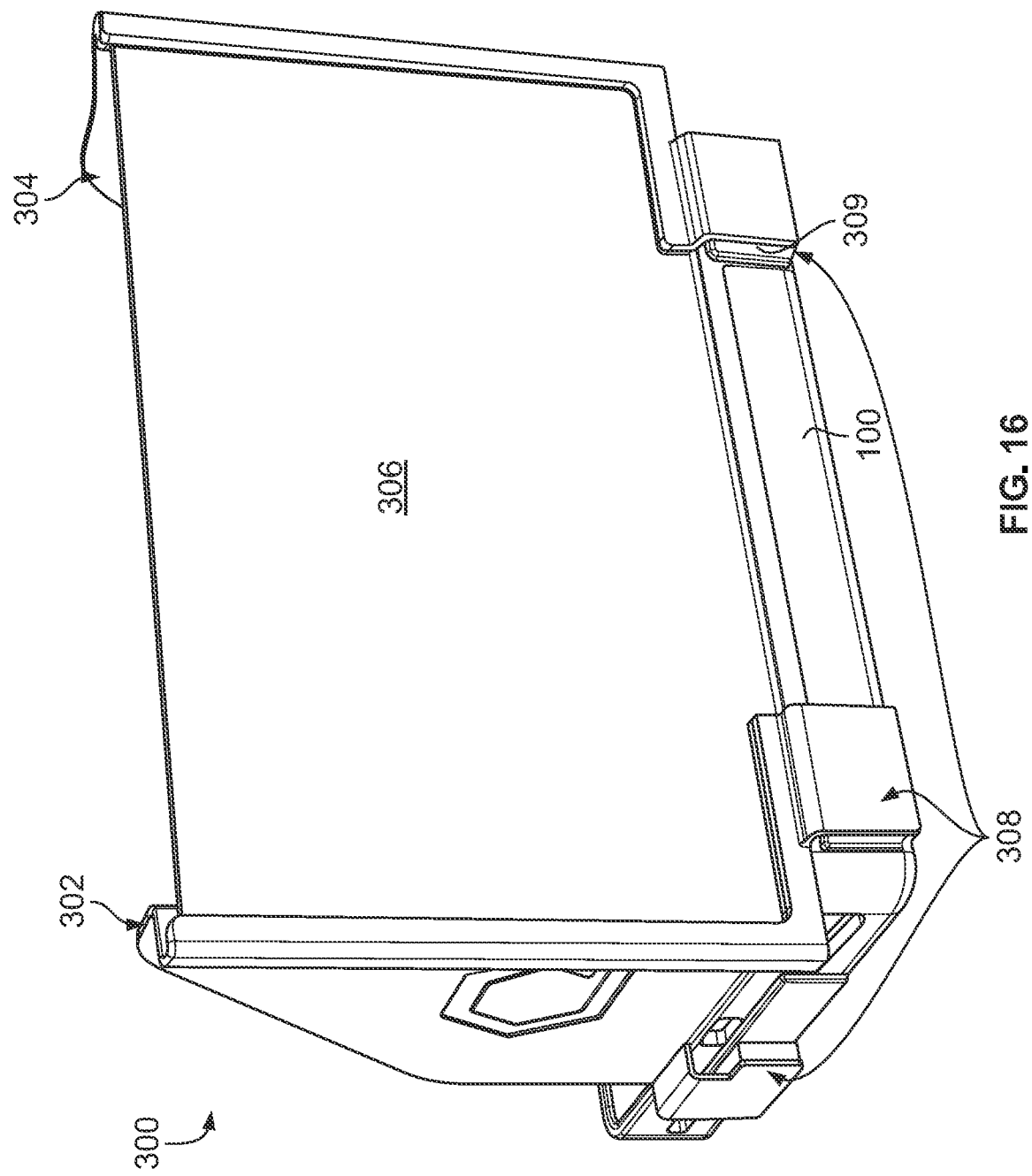
FIGS. 16-19 illustrate example components of a document holder that may be used with the multi-purpose thermoregulating electronics device case constructed in accordance with the disclosed principles.
Figure 17:
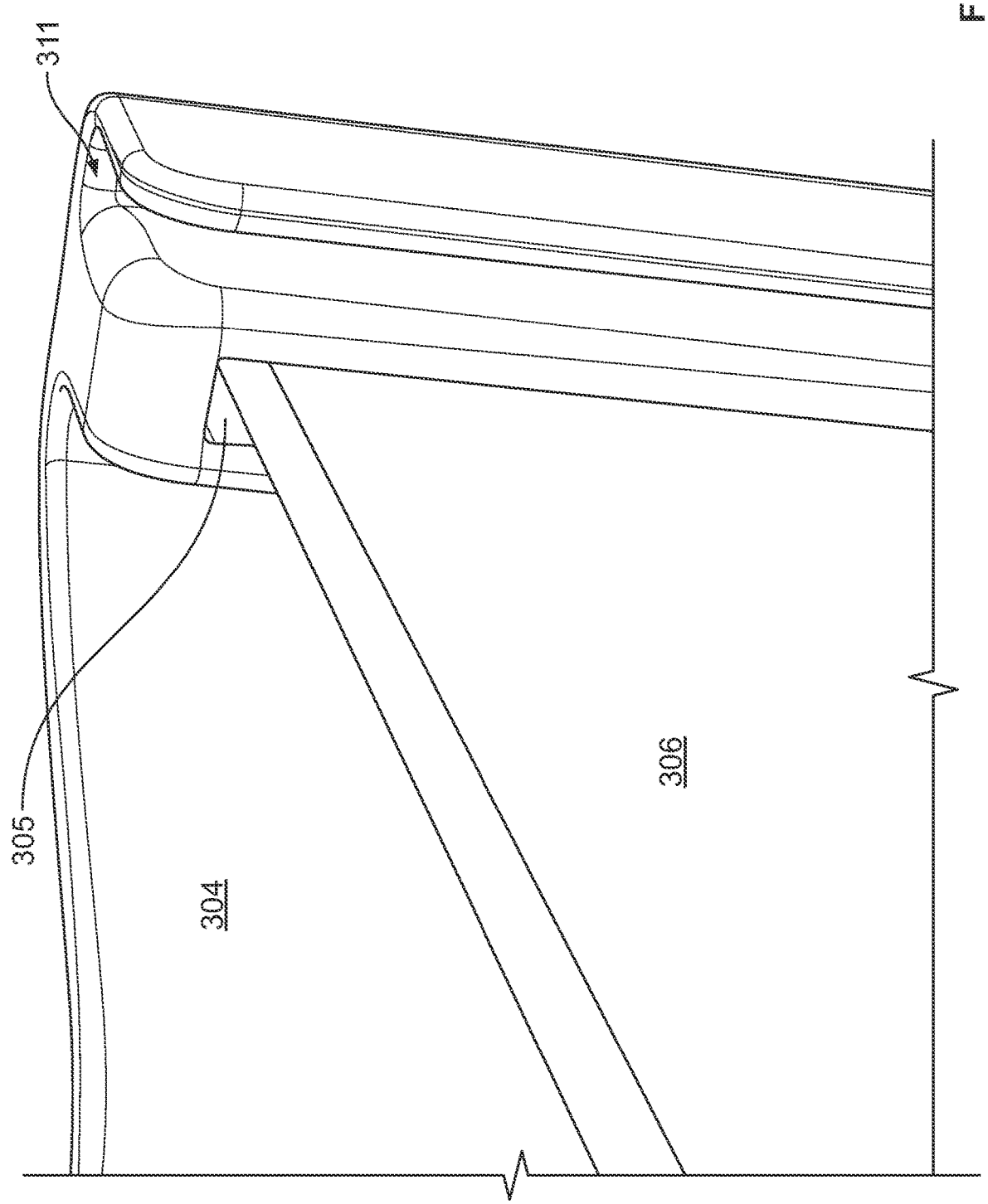
Figure 18:
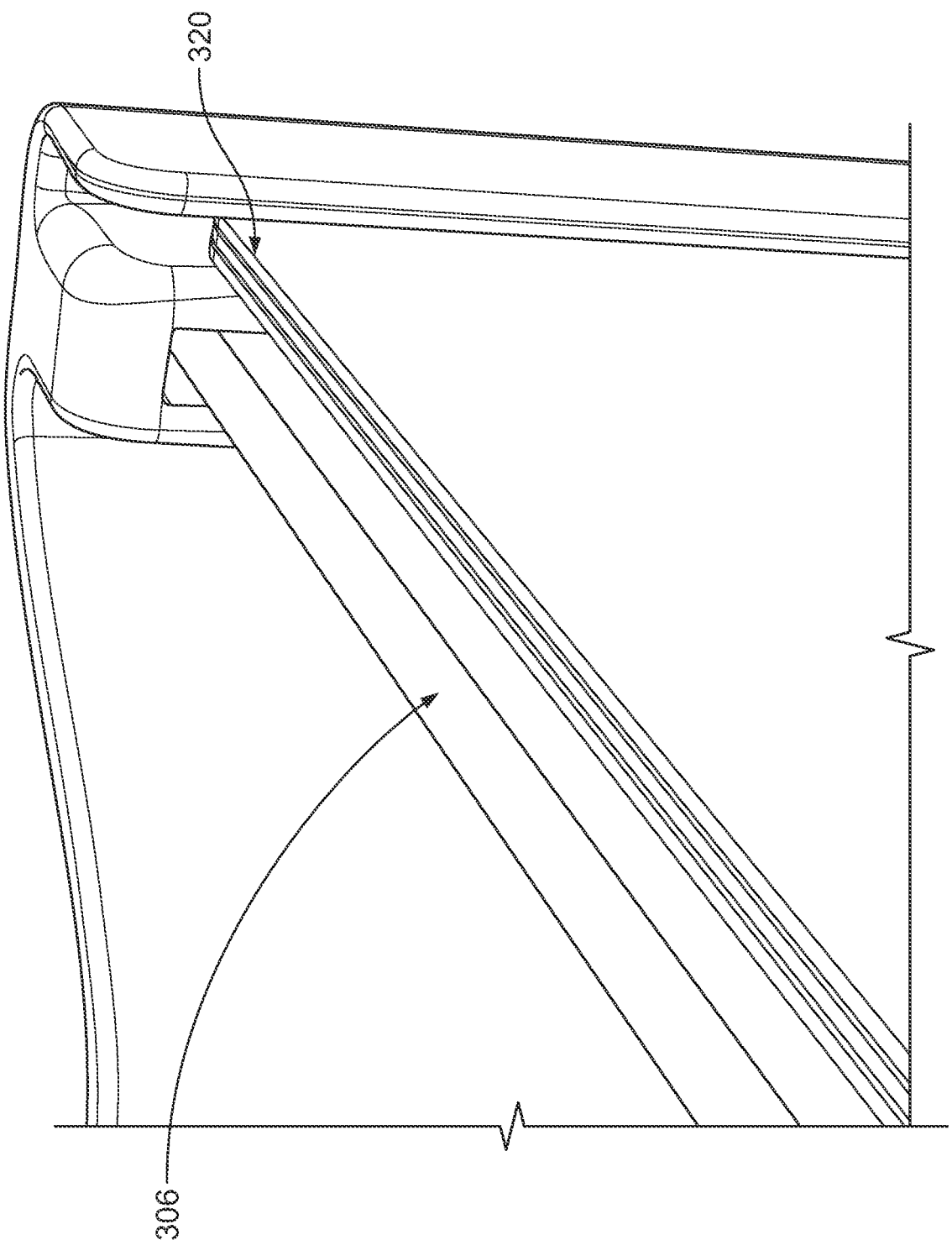
Figure 19:
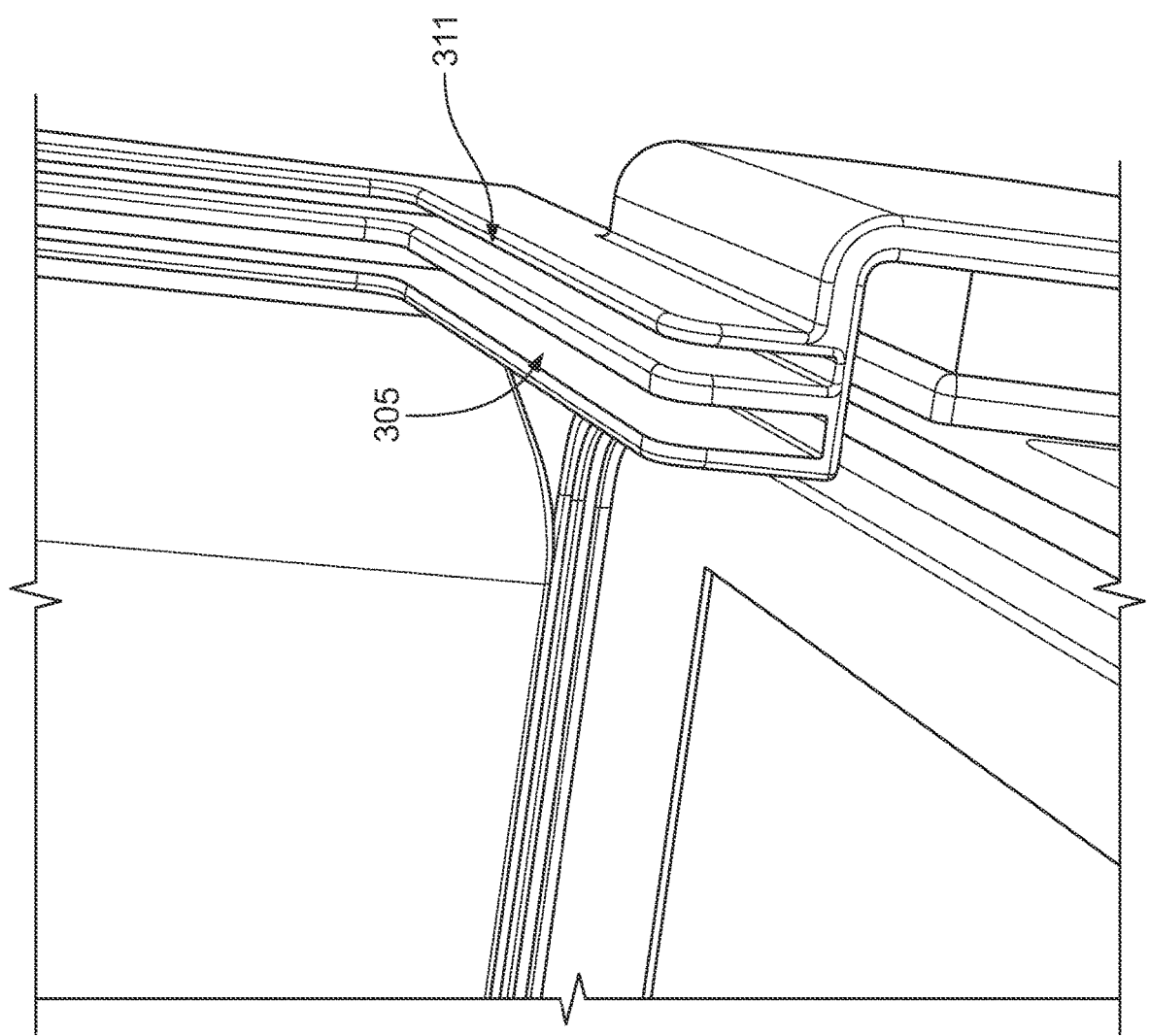

FIG. 15 illustrates an example strap mechanism 190 for the multi-purpose thermoregulating electronics device case 50 constructed in accordance with the disclosed principles. In the illustrated example, there are two straps 190 that are adapted to be connected to the user's uniform and or equipment worn by the wearer. In the illustrated example, each strap 190 has a strap portion 192 coupled to a first connector portion 194 and a second connector portion 198. A strap adjuster 196 is included to adjust the size of the strap as is known in the art.

As shown in FIG. 15, the first connector portion 194 includes a clip that may be used to clip on to the loop portion of the tension-fit accessory 118. This allows quick and easy engagement and disengagement from the case 50. In one embodiment, the second connector portion 198 is part of a buckle type connector, with the other portion of the buckle being on the user and or its equipment. It one or more embodiments, the strap mechanism 190 could comprise a longer strap portion connected between two clip portions, such that the clip portions can clip onto a tension-fit accessory 118 located at different sides of the case.

In a further embodiment, referring to FIGS. 16-19, a document holder 300 may be attached to the multi-purpose thermoregulating electronics device case 50 constructed in accordance with the disclosed principles. As will become apparent, the orientation of the documents and shielding providing by the holder 300 are for the purpose of displaying documentation for presentation from the device 10 user to another person(s) in a transactional setting. In holding the documents and shielding in a position for display to customers/people in a transactional setting, the documents and shielding also serve to protect the portable computing device from external threats such as weather (precipitation, wind, sun), debris, discharged bodily fluids, and/or any other external threat to the portable computing device.

The holder 300 includes a pair of split side shields 302, 304 that hold a main shield 306 in main shield slots 305 formed in the shields 302, 304. One or more documents 320 may be maintained in a document slot 311 formed in the shields 302, 304. In one or more embodiments, the upper portion of each document slot 311 will have a flared portion 312 to help with document handling. In one or more embodiments, the upper portion of each document slot 311 may have a radius/curve or be sloped to make replacing the documents easier, faster and more accurate.

In the illustrated embodiment, each shield 302, 304 includes one or more mounting platform tabs 308, 309 to help maintain the shields 302, 304 on the case 50. In the illustrated embodiments, one side of the mounting platform tabs 308, 309 includes a pad 308a, 309a or other material to prevent damage to the device, prevent slippage/movement of the shields, and or to increase the engagement with the device.

The illustrated example is shown in use with a tablet such as an IPAD 10.2 tablet. The main shield/document dimensions shown in the illustrated example are 6.835"×5.3". In addition, the case 50 dimensions may be 10.25"×7.1875"×1.5". These dimensions are examples only and other dimensions are possible. While this geometry is desirable, the shape does not have to be exactly as shown—all that is required is for the split side shields 302, 304 to consist of two pieces with interchangeable center shielding 306 backstopping the documents. In one or more embodiments, the document holder 300 may consist solely of the two side shields 302, 304, without the main shield 306. That is the two side shields 302, 304 may be applied to the case 50 and be suitable to maintain a document 320 without a main shield 306.

In one or more embodiments, the document holder 300 has multiple slots to accommodate the variable dimensions of the main shield 306 as well as the multiple documents required for some transactions like drive-thru restaurants. The components of the document holder 300 can be made from any load-bearing material such as ABS, Kydex, HDPE, Carbon Fiber, Steel, Aluminum, etc. ABS plastic is shown, but other materials can be used. The document holder 300, like the case 50, can be manufactured using any number of manufacturing techniques including, but not limited to injection molding, CNC Machining, Casting, etc.

The embodiments show a pair of unique, mirrored, geometric shaped shield portions 302, 304, which provide side shielding, hold a supplemental and adjustable main shield 306 and hold multiple documents simultaneously. The separation of the two shields 302, 304 allows the use of different size shields and multiple documents with simple adapters.

In summary, the disclosed principles include a multi-purpose thermoregulating electronics device case 50 that holds a portable computing device 10 and an interchangeable thermoregulation element 130 such that the thermoregulation element can be replaced without removing (or moving) the portable computing device. In one or more embodiments, the case 50 includes an attachment system around the perimeter of the case that provides for interchangeable tension-fit pass-through accessories 118, 175.

Moreover, the floor of the case organically secures/presses the thermoregulation element that directly against the electronic device to affect heat transfer. The tension and dimensions of the case are such that the thermal element is held in direct contact with the electronic device when in the case. The thermoregulation element is interchangeable and fits securely into the case (via a magazine) without removal of the electronic device.

In one or more embodiments, an external shield that blocks light or droplets is provided for removable attachment to the case. As noted above, the case is universal as it accommodates multiple device sizes through the adapters and tension-fit accessories without affecting the original footprint of the case.

In one or more embodiments, an external document holder is provided for removable attachment to the case. The holder comprises flaring and slotting for holding/displaying/inserting documents and providing protective shielding for portable computing devices used with the case.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s)

how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. A case for holding a portable computing device, said case comprising:
    a case body having an opening that receives the portable computing device and a cavity that receives a magazine,
        the magazine holding an interchangeable thermoregulation element, said magazine fitting within the cavity in the case body such that a bottom of the case body pushes on the magazine such that the thermoregulation element makes contact with the portable computing device when inserted in the cavity and carrying the thermoregulation element;
    an adapter that supports the portable computing device within walls of the case body; and
    an attachment system around a perimeter of the case body, the attachment system maintaining the adapter on the case body by a tension-fit.

2. The case of claim 1, wherein the magazine can be removed from the case body and the thermoregulation element can be replaced without removing or moving the portable computing device.

3. The case of claim 1, wherein the attachment system comprises:
    a plurality of slots formed within the walls of the case body; and
    a plurality of tension-fit accessories, each fitting within a slot and contacting the adapter.

4. The case of claim 1, wherein the case body comprises an adapter cavity that receives a bottom portion of the adapter.

5. The case of claim 4, wherein a top portion of the adapter matches a size of the portable computing device.

6. The case of claim 1, wherein the thermoregulation element affects heat transfer when pressed against the portable computing device.

7. The case of claim 1, further comprising an external shield attached to an outside portion of the case body.

8. The case of claim 7, wherein the case body comprises slots that receive attachment mechanisms for attaching the external shield to the case body.

9. The case of claim 1, further comprising an attachment system around a perimeter of the case body, the attachment system connecting to a strap mechanism that allows the case to be worn by a user.

10. A case for holding a portable computing device, said case comprising:
    a case body having an opening that receives the portable computing device and a cavity that receives a magazine,
        the magazine holding an interchangeable thermoregulation element, said magazine fitting within the cavity in the case body such that a bottom of the case body pushes on the magazine such that the thermoregulation element makes contact with the portable computing device when inserted in the cavity and carrying the thermoregulation element, and
        the magazine comprising a faceplate and three walls connected to a bottom portion of the magazine, the thermoregulation element being held between the walls and the bottom portion of the magazine.

11. The case of claim 10, wherein the cavity comprises two side walls and a back wall attached to the bottom of the case body, the two side walls and the back wall maintaining the magazine in place by tension fit.

12. A case for holding a portable computing device, said case comprising:
    a case body having an opening that receives the portable computing device and a cavity that receives a magazine;
    one or more attachment accessories maintaining an adapter within the case body, the adapter supporting the portable computing device within walls of the body;
    the magazine holding an interchangeable thermoregulation element, the thermoregulation element providing thermoregulation to the portable computing device when in contact with the portable computing device,
    wherein the magazine can be removed from the case body and the thermoregulation element can be replaced without removing or moving the portable computing device.

13. The case of claim 12, wherein the case body comprises a plurality of slots formed within the walls of the case body and the one or more attachment accessories fitting within a slot and contacting the adapter.

14. The case of claim 12, wherein the one or more attachment accessories have a looped portion connecting to a strap mechanism that allows the case to be worn by a user.

15. The case of claim 12, wherein the magazine comprises a faceplate and three walls connected to a bottom portion of the magazine, the thermoregulation element held between the walls and the bottom portion of the magazine.

16. The case of claim 15, wherein the cavity comprises two side walls and a back wall attached to the bottom of the case body, the two side walls and the back wall maintaining the magazine in place by tension fit, wherein a bottom of the case body urges the thermoregulation element into contact with the portable computing device.

17. The case of claim 12, further comprising an external shield attached to an outside portion of the case body, and the case body comprises slots that receive attachment mechanisms for attaching the external shield to the case body.

18. The case of claim 12, wherein the case body comprises an adapter cavity that receives a bottom portion of the adapter, and a top portion of the adapter matches a size of the portable computing device.

* * * * *